United States Patent
Kim et al.

(10) Patent No.: US 10,062,631 B2
(45) Date of Patent: Aug. 28, 2018

(54) POWER MODULE

(71) Applicant: Hyundai Motor Company, Seoul (KR)

(72) Inventors: Young Seok Kim, Hyeonggi-do (KR); Hyun Woo Noh, Seoul (KR); Kyoung Kook Hong, Gyeonggi-do (KR); Su Bin Kang, Yongin-si (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 15/181,044

(22) Filed: Jun. 13, 2016

(65) Prior Publication Data

US 2017/0170091 A1 Jun. 15, 2017

(30) Foreign Application Priority Data

Dec. 9, 2015 (KR) ......................... 10-2015-0174805

(51) Int. Cl.
| | |
|---|---|
| *H01L 23/367* | (2006.01) |
| *H01L 23/495* | (2006.01) |
| *H01L 23/00* | (2006.01) |
| *H01L 23/492* | (2006.01) |

(52) U.S. Cl.
CPC ........ *H01L 23/3675* (2013.01); *H01L 23/492* (2013.01); *H01L 23/49537* (2013.01); *H01L 24/33* (2013.01); *H01L 23/367* (2013.01); *H01L 23/49541* (2013.01); *H01L 2224/29139* (2013.01); *H01L 2224/32245* (2013.01); *H01L 2224/33181* (2013.01); *H01L 2924/17747* (2013.01)

(58) Field of Classification Search
CPC ....... H01L 2924/00; H01L 2924/00014; H01L 2924/13055; H01L 2924/00012; H01L 2924/1305; H01L 2924/13091; H01L 2224/73265; H01L 23/3735
USPC ......... 361/709, 715, 728; 257/676; 174/252; 438/122
See application file for complete search history.

(56) References Cited

U.S. PATENT DOCUMENTS

| | | |
|---|---|---|
| 4,710,795 A | 12/1987 | Nippert et al. |
| 8,358,000 B2 | 1/2013 | Beaupre et al. |
| 2004/0056346 A1 | 3/2004 | Palm et al. |

(Continued)

FOREIGN PATENT DOCUMENTS

| | | |
|---|---|---|
| JP | 2004-525503 A | 8/2004 |
| JP | 2013-012641 A | 1/2013 |

(Continued)

*Primary Examiner* — Jonathan Han
(74) *Attorney, Agent, or Firm* — Mintz Levin Cohn Ferris Glovsky and Popeo, P.C.; Peter F. Corless

(57) ABSTRACT

A power module capable of increasing structural stability and reliability at high temperatures includes: an upper substrate having a metal layer; a lower substrate spaced apart from the upper substrate and having a metal layer facing the metal layer of the upper substrate; a semiconductor element configured to be disposed between the upper substrate and the lower substrate; and at least one leg portion formed on at least one of the metal layer of the upper substrate and the metal layer of the lower substrate to make the upper substrate and the lower substrate be spaced apart from each other at a predetermined interval, in which the leg portion may be electrically connect the semiconductor element to the metal layer of the upper substrate or the metal layer of the lower substrate.

11 Claims, 4 Drawing Sheets

(56) References Cited

U.S. PATENT DOCUMENTS

| | | | | |
|---|---|---|---|---|
| 2013/0265724 A1* | 10/2013 | Kaneko | ............... | H01L 21/50 |
| | | | | 361/715 |
| 2014/0117525 A1* | 5/2014 | Lee | ............... | H01L 23/3121 |
| | | | | 257/676 |
| 2014/0118956 A1* | 5/2014 | Kim | ............... | H01L 23/049 |
| | | | | 361/728 |
| 2014/0138075 A1* | 5/2014 | Yang | ............... | H01L 23/3735 |
| | | | | 165/185 |
| 2014/0321062 A1* | 10/2014 | Ng | ............... | H01L 23/3675 |
| | | | | 361/719 |
| 2014/0327127 A1* | 11/2014 | Hable | ............... | H01L 21/50 |
| | | | | 257/712 |
| 2014/0327436 A1* | 11/2014 | Castro Serrato | ....... | G01R 33/07 |
| | | | | 324/252 |

FOREIGN PATENT DOCUMENTS

| JP | 2015-002273 A | 1/2015 |
|---|---|---|
| KR | 10-1459857 B1 | 11/2014 |
| KR | 10-2015-0045815 A | 4/2015 |

\* cited by examiner

POWER MODULE

CROSS-REFERENCE TO RELATED APPLICATION

This application claims the benefit of Korean Patent Application No. 10-2015-0174805, filed on Dec. 9, 2015 in the Korean Intellectual Property Office, the entire contents of which are incorporated by reference herein.

BACKGROUND (a) Technical Field

The present invention relates to a power module, and more particularly, to a power module capable of increasing structural stability while remaining stable and reliable at high temperatures.

(b) Description of the Related Art

A power module is a component mounted in substantially all electronic devices and serves to supply power, convert power, and secure stability and efficiency.

Examples of the power module include: an insulated gate bipolar transistor (IGBT) module that may be placed in a dedicated case while having a plurality of diodes mounted therein, a current sensor-embedded intelligent power module (IPM) to which a protective circuit for overcurrent, overheat, or the like is added, and a metal oxide semiconductor field effect transistor (MOSFET) module.

In addition, some of power modules such as a dual side cooling type power module may be formed in a structure having two substrates spaced apart from each other to face each other.

The two substrates consist of an upper substrate and a lower substrate spaced apart from each other in up and down directions, in which a semiconductor element may be installed between the upper substrate and the lower substrate and a lead may be electrically connected to an electrode of the semiconductor element through a wire.

In this case, if the wire contacts the upper substrate, an electrical short-circuit may occur. For this reason, a spacer may be installed between the upper substrate and the lower substrate to secure a vertical interval between the upper substrate and the lower substrate, thereby preventing the wire from being contacted with the upper substrate.

However, the existing power module has a disadvantage in that if stress is applied to the semiconductor element due to thermal expansion under a high temperature condition, deformation of the spacer may be severe, and the deformation of the spacer may cause deformation of the upper substrate and/or the lower substrate, thus reducing stability and reliability of the power module at the high temperature.

Further, the spacer is mainly made of a Cu—Mo material. However, the spacer of the Cu—Mo material may have a large electric resistance and may be very expensive.

Further, the existing power module has a disadvantage in that both ends of the wire are bonded to the semiconductor element and the lead by ultrasonic bonding, and therefore short-circuiting at the bonding surface may easily occur due to a relatively lower external force. Moreover, a bonding area of the wire is narrow and therefore the wire may be easily fractured due to a concentrated external force.

SUMMARY

An aspect of the present invention provides a power module capable of increasing structural stability while securing stability and reliability at high temperatures and reducing an electric resistance, improving durability, or the like by simplifying a manufacturing process.

According to an exemplary embodiment of the present invention, a power module includes an upper substrate configured to have a metal layer; a lower substrate configured to be spaced apart from the upper substrate and have a metal layer facing the metal layer of the upper substrate; a semiconductor element configured to be disposed between the upper substrate and the lower substrate; and at least one leg portion configured to be formed on at least one of the metal layer of the upper substrate and the metal layer of the lower substrate to make the upper substrate and the lower substrate be spaced apart from each other by predetermined interval, in which the leg portion may be configured to electrically connect the semiconductor element to the metal layer of the upper substrate or the metal layer of the lower substrate.

A top surface and a bottom surface of the semiconductor element may be electrically connected to the metal layer of the upper substrate and the metal layer of the lower substrate by an adhesive.

A top surface of the upper substrate and a bottom surface of the lower substrate may be each provided with a cooling module.

According to another exemplary embodiment of the present invention, a power module includes an upper substrate configured to have an upper insulating layer and a metal layer formed on a bottom surface of the upper insulating layer; a lower substrate configured to be spaced apart from the upper substrate, and having a lower insulating layer, and a metal layer formed on a top surface of the lower insulating layer; at least one semiconductor element configured to be connected to a connection layer of the upper substrate and a connection layer of the lower substrate, respectively; and at least one leg portion configured to be bent from the metal layer of the upper substrate toward the lower substrate, in which the leg portion may have a bonding end part bonded to the metal layer of the lower substrate.

The bonding end part of the leg portion may be bonded to the metal layer of the lower substrate by an adhesive.

The leg portion may be formed to be bent at an edge of the metal layer of the upper substrate and the height of the leg portion may be equal to an interval between a bottom surface of the upper substrate and a top surface of the lower substrate.

The metal layer of the lower substrate may be integrally formed with a lead.

The upper substrate may further include a metal layer formed on a top surface of the upper insulating layer.

An upper part of the upper substrate may be connected to an upper cooling module.

The lower substrate may further include a metal layer formed on a bottom surface of the lower insulating layer.

A lower part of the lower substrate may be connected to a lower cooling module.

According to another exemplary embodiment of the present invention, a power module includes an upper substrate configured to have an upper insulating layer and a metal layer formed on a bottom surface of the upper insulating layer; a lower substrate configured to be spaced apart from the upper substrate, and having a lower insulating layer, and a metal layer formed on a top surface of the lower insulating layer; at least one semiconductor element configured to be connected to a connection layer of the upper substrate and a connection layer of the lower substrate, respectively; and at least one leg portion configured to be bent from the metal layer of the lower substrate toward the upper substrate, in which the leg portion may have a bonding end part bonded to the metal layer of the upper substrate.

The bonding end part of the leg portion may be bonded to the metal layer of the upper substrate by an adhesive.

The leg portion may be formed to be bent at an edge of the metal layer of the lower substrate and the height of the leg portion may be equal to an interval between a bottom surface of the upper substrate and a top surface of the lower substrate.

The metal layer of the upper substrate may be integrally formed with the lead.

The upper substrate may further include the metal layer formed on the top surface of the upper insulating layer.

The upper part of the upper substrate may be connected to the upper cooling module.

The lower substrate may further include the metal layer formed on the bottom surface of the lower insulating layer.

The lower part of the upper substrate may be connected to the lower cooling module.

BRIEF DESCRIPTION OF THE DRAWINGS

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-of", and "module" described in the specification mean units for processing at least one function and operation, and can be implemented by hardware components or software components and combinations thereof.

Further, the control logic of the present invention may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

The above and other objects, features and advantages of the present invention will be more apparent from the following detailed description taken in conjunction with the accompanying drawings.

Figure 1:
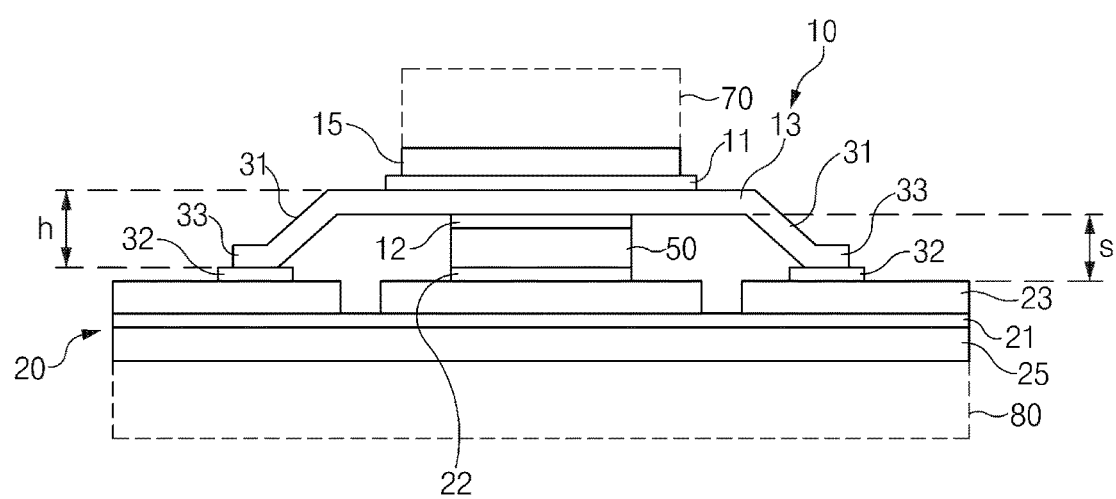

FIG. 1 is a side cross-sectional view of a power module according to an exemplary embodiment of the present invention.

Figure 2:
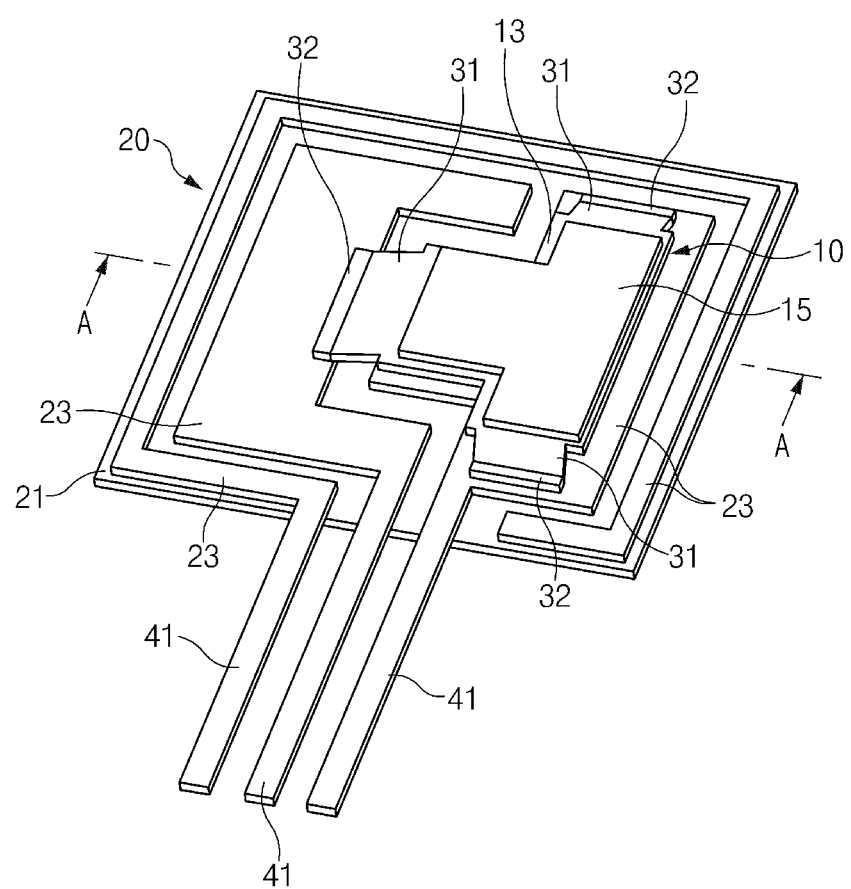

FIG. 2 is a perspective view of a power module according to another exemplary embodiment of the present invention.

Figure 3:
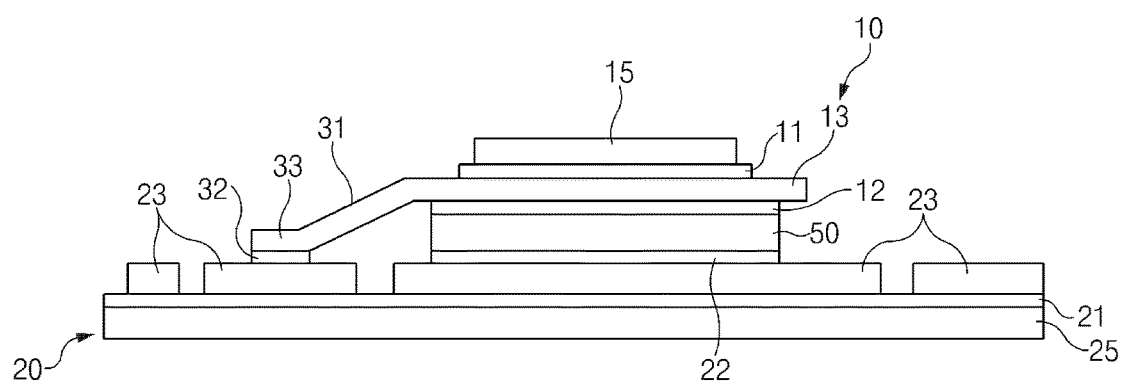

FIG. 3 is a cross-sectional view taken along line A-A in FIG. 2.

Figure 4:
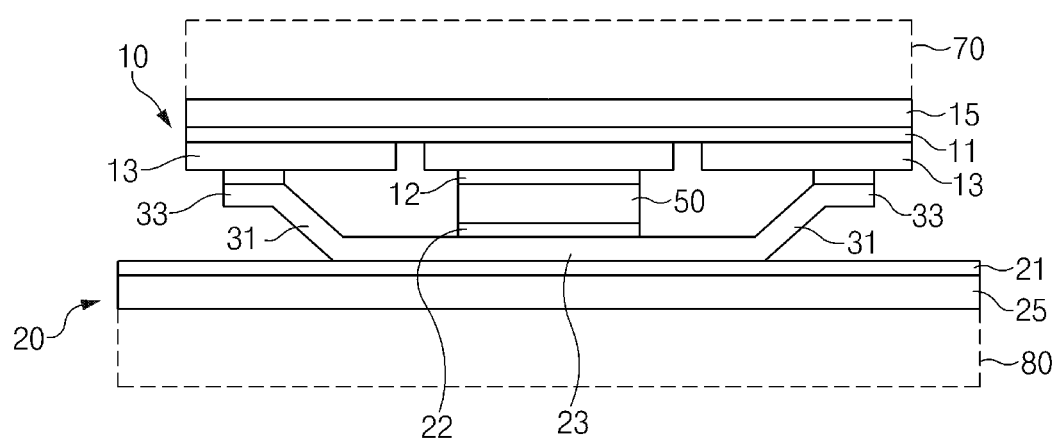

FIG. 4 is a side cross-sectional view of a power module according to yet another exemplary embodiment of the present invention.

DETAILED DESCRIPTION

Hereinafter, exemplary embodiments of the present invention will be described in detail with reference to the accompanying drawings. For reference, a size of components, a thickness of a line, and the like which are illustrated in the drawing referenced for describing exemplary embodiments of the present invention may be slightly exaggerated for convenience of understanding. Further, terms used to describe the present invention are defined in consideration of functions in the present invention and therefore may be changed depending on a user, an operator's intention, a practice, and the like. Therefore, the definition of the terminologies should be construed based on the contents throughout the specification.

Referring to FIG. 1, a power module according to various exemplary embodiments of the present invention may include an upper substrate 10, a lower substrate 20 spaced apart from the upper substrate 10, and a semiconductor element 50 installed between the upper substrate 10 and the lower substrate 20. As provided herein, the semiconductor element 50 refers to one or more semiconductor elements, e.g., active devices such as semiconductor chips and/or passive devices such as inductors or capacitors.

The upper substrate 10 may include an upper insulating layer 11 and at least one metal layer 13 formed on a bottom surface of the upper insulating layer 11.

The upper insulating layer 11 may be made of insulating materials such as ceramic and the metal layer 13 may be made of conductive materials such as copper.

Further, even a top surface of the upper insulating layer 11 may be formed with a metal layer 15 of the conductive materials such as copper.

The lower substrate 20 may include a lower insulating layer 21 and at least one metal layer 23 formed on a top surface of the lower insulating layer 21.

The lower insulating layer 21 may be made of the insulating materials such as ceramic and the metal layer 23 may be made of the conductive materials such as copper.

Further, even a bottom surface of the lower insulating layer 21 may be formed with a metal layer 25 of the conductive metal materials such as copper.

Meanwhile, at least one leg portion 31 may be integrally formed on the metal layer 13 of the upper substrate 10 or the metal layer 23 of the lower substrate 20, in which the leg portion 31 may be formed to be bent from the metal layer 13 of the upper substrate 10 or the metal layer 23 of the lower substrate 20 toward an opposite substrate, such that the upper substrate 10 and the lower substrate 20 may be spaced apart from each other at a predetermined interval.

Referring to FIG. 1, the leg portion 31 may be integrally formed on the metal layer 13 of the upper substrate 10. In particular, the leg portion 31 may be bent to be inclined from the metal layer 13 of the upper substrate 10 toward the metal layer 23 of the lower substrate 20, and a lower end of the leg portion 31 may be formed with a bonding end part 33 bonded to the metal layer 23 of the lower substrate 20.

The bonding end part 33 of the leg portion 31 may be bonded by an adhesive 32 made of a conductive material such as silver (Ag).

The bonding area of the bonding end part 33 may be controlled depending on a conducted intensity of current. Therefore, it is preferable to minimize the bonding area of the bonding end part 33 in consideration of the deformation of the upper substrate 10.

Further, the leg portion 31 preferably is formed in at least three portions, and as a result, a stable support structure may be implemented.

In particular, an interval s between the upper substrate 10 and the lower substrate 20 may be determined by a vertical height h of the leg portion 31.

The semiconductor element 50 may be installed between the upper substrate 10 and the lower substrate 20. In particular, the top surface of the semiconductor element 50 is bonded to the metal layer 13 of the upper substrate 10 by the adhesive 12 and may be electrically connected, and the bottom surface of the semiconductor element 50 is bonded to the metal layer 23 of the lower substrate 20 by an adhesive 22 and may be electrically connected. The adhesives 12 and 22 may be made of a conductive material such as silver.

As described above, as the leg portion 31 electrically connects between the metal layer 13 of the upper substrate 10 and the metal layer 23 of the lower substrate 20 and the top surface and the bottom surface of the semiconductor element 50 are electrically connected to the metal layer 13 of the upper substrate 10 and the metal layer 23 of the lower substrate 20, the electrode of the semiconductor element 50 may be electrically connected to the metal layer 23 of the lower substrate 20, such that the wire bonding of the existing power module may be replaced.

In summary, according to the exemplary embodiment of the present invention, as compared to existing wire bonding, the leg portion 31 electrically connects between the electrode of the semiconductor element 50 and the metal layer 23 of the lower substrate 20, the bonding area of the bonding end part 33 of the leg portion 31 is larger than that of the wire, such that the resistance against the external force may be improved, and the leg portion 31 intensively applies a stress to the semiconductor element 50, such that the structural rigidity may be greatly improved.

FIG. 2 is a perspective view of a power module according to another exemplary embodiment of the present invention, and FIG. 3 is a cross-sectional view taken along the line A-A in FIG. 2.

FIGS. 2 and 3 illustrate a structure in which three leg portions 31 on the metal layer 13 of the upper substrate 10 are bent to be inclined toward the lower substrate 20.

As such, according to the exemplary embodiment of the present invention, at least three leg portions 31 are bonded to the metal layer 23 of the lower substrate 20, such that the structural stability may be greatly improved. In particular, according to the exemplary embodiment depicted in FIGS. 2-3, three leg portions 31 preferably are provided, although any number of leg portions (e.g., 1, 2, 3, 4, 5, or more) can be provided.

Further, the metal layer 23 of the lower substrate 20 may be integrally formed with a lead 41 electrically connected between the semiconductor element 50 and an external circuit. As a result, as a separate bonding process for the lead 41 is not required, a manufacturing process is simplified, thereby greatly reducing manufacturing costs.

FIG. 4 is a side cross-sectional view of a power module according to yet another exemplary embodiment of the present invention.

Referring to FIG. 4, the leg portion 31 may be integrally formed on the metal layer 23 of the lower substrate 20. In particular, the leg portion 31 may be bent to be inclined from the metal layer 23 of the lower substrate 20 toward the metal layer 13 of the upper substrate 10 and an upper end of the leg portion 31 may be formed with the bonding end part 33 bonded to the metal layer 13 of the upper substrate 10.

The remaining components are similar to or the same as the foregoing exemplary embodiments and therefore the detailed description thereof will be omitted.

As described above, according to the exemplary embodiments of the present invention, the leg portion which may space the upper substrate and the lower substrate from each other may be integrally formed on the upper substrate or the lower substrate to replace a separate spacer, thereby reducing the electric resistance and improving the durability as well as simplifying the manufacturing process.

Further, according to the exemplary embodiments of the present invention, the leg portion may control the interval between the upper substrate and the lower substrate to be fitted with the semiconductor element to effectively implement the thin-type structure on the whole, thereby miniaturizing the power module.

In particular, according to the exemplary embodiments of the present invention, instead of the spacer, the leg portion spaces the upper substrate and the lower substrate from each other, and the top surface and the bottom surface of the semiconductor element are directly bonded to the upper substrate and the lower substrate. Therefore, the stress applied to the semiconductor element may be reduced even when thermal expansion occurs under high temperature conditions to prevent the upper substrate and the lower substrate from being deformed, thereby greatly improving the stability and reliability at the high temperature.

Further, according to the exemplary embodiments of the present invention, as the leg portion electrically connects the semiconductor element to the metal layer of the upper substrate or the metal layer of the lower substrate, separate wire bonding is not required, thereby improving the structural stability.

Hereinabove, although the present invention has been described with reference to exemplary embodiments and the accompanying drawings, the present invention is not limited thereto, but may be variously modified and altered by those skilled in the art to which the present invention pertains without departing from the spirit and scope of the present invention claimed in the following claims.

What is claimed is:

1. A power module, comprising:
   an upper substrate having a metal layer;
   a lower substrate spaced apart from the upper substrate and having a metal layer facing the metal layer of the upper substrate;
   a semiconductor element disposed between the upper substrate and the lower substrate; and
   at least one leg portion formed on at least one of the metal layer of the upper substrate and the metal layer of the lower substrate to make the upper substrate and the lower substrate be spaced apart from each other at a predetermined interval, wherein the leg portion is configured to electrically connect the semiconductor element to the metal layer of the upper substrate or the metal layer of the lower substrate.

2. The power module according to claim 1, wherein a top surface and a bottom surface of the semiconductor element are electrically connected to the metal layer of the upper substrate and the metal layer of the lower substrate by an adhesive.

3. The power module according to claim 1, wherein a top surface of the upper substrate and a bottom surface of the lower substrate are each provided with a cooling module.

4. A power module, comprising:
an upper substrate having an upper insulating layer and a metal layer formed on a bottom surface of the upper insulating layer;
a lower substrate spaced apart from the upper substrate, and having a lower insulating layer, and a metal layer formed on a top surface of the lower insulating layer;
a semiconductor element connected to a connection layer of the upper substrate and a connection layer of the lower substrate, respectively; and
at least one leg portion bent from the metal layer of the upper substrate toward the lower substrate,
wherein the leg portion has a bonding end part bonded to the metal layer of the lower substrate.

5. The power module according to claim 4, wherein the bonding end part of the leg portion is bonded to the metal layer of the lower substrate by an adhesive.

6. The power module according to claim 4, wherein the leg portion is formed to be bent at an edge of the metal layer of the upper substrate, and an interval between a bottom surface of the upper substrate and a top surface of the lower substrate is determined based on a height of the leg portion.

7. The power module according to claim 4, wherein the metal layer of the lower substrate is integrally formed with a lead.

8. The power module according to claim 4, wherein the upper substrate further includes a metal layer formed on a top surface of the upper insulating layer.

9. The power module according to claim 4, wherein an upper part of the upper substrate is connected to an upper cooling module.

10. The power module according to claim 4, wherein the lower substrate further includes a metal layer formed on a bottom surface of the lower insulating layer.

11. The power module according to claim 4, wherein a lower part of the lower substrate is connected to a lower cooling module.

* * * * *